United States Patent
Bedard

(10) Patent No.: US 6,411,513 B1
(45) Date of Patent: Jun. 25, 2002

(54) COMPLIANT THERMAL INTERFACE DEVICES AND METHOD OF MAKING THE DEVICES

(76) Inventor: Jacques Normand Bedard, 48 Kenmare Place, Nepean, Ontario (CA), K2J 3L9

( * ) Notice: Subject to any disclaimer, the term of this patent is extended or adjusted under 35 U.S.C. 154(b) by 0 days.

(21) Appl. No.: 09/731,014

(22) Filed: Dec. 7, 2000

Related U.S. Application Data

(60) Provisional application No. 60/169,937, filed on Dec. 10, 1999.

(51) Int. Cl.$^7$ .................................................. H05K 7/20
(52) U.S. Cl. ...................... 361/704; 174/16.3; 165/80.2; 165/185; 257/707; 257/713; 257/722; 361/710; 361/715
(58) Field of Search ............................... 165/80.2–80.4, 165/185; 174/16.3; 361/688, 690, 702–704, 707–722; 257/706–707, 712–713, 718–719, 722, 726–727; 29/890.03; 267/150, 160

(56) References Cited

U.S. PATENT DOCUMENTS

| | | | | |
|---|---|---|---|---|
| 3,746,087 A | * | 7/1973 | Lavering et al. ............. 165/185 |
| 3,823,772 A | * | 7/1974 | Lavering et al. ............. 165/81 |
| 4,156,458 A | * | 5/1979 | Chu et al. ...................... 165/81 |
| 4,358,707 A | * | 11/1982 | Delory et al. .............. 315/5.38 |
| 4,448,240 A | * | 5/1984 | Sharon ...................... 165/80.3 |
| 4,993,482 A | * | 2/1991 | Dolbear et al. ............ 165/80.2 |
| 5,528,456 A | * | 6/1996 | Takahashi ................... 361/704 |
| 5,557,501 A | * | 9/1996 | Distefano et al. ........... 361/704 |
| 5,650,914 A | * | 7/1997 | Distefano et al. ........... 361/704 |
| 6,259,602 B1 | * | 7/2001 | Maihammar ................ 361/704 |

* cited by examiner

Primary Examiner—Gregory Thompson

(57) ABSTRACT

A compliant, thermally conductive interface device for use between two surfaces, such as a component and a heat sink surface, that can accommodate a range of gap distances and angular misalignment (tilt). The device is comprised of a plurality of foils (28) stacked in a densely-packed, nested fashion. The foils may extend between the surfaces (30, 32). Embodiments are described for use with flat, two-dimensionally curved, three-dimensionally curved, and cylindrical surfaces (such as heat pipes). Preferably, the foils are pre-formed in a shape corresponding to their fully compressed shape in a device and stacked directly against each other. After bonding the plurality of adjacent foil proximal edges (34) together and the plurality of adjacent foil distal edges (38) together, the assembly is extended to produce interstitial separation distances (42) between adjacent foil flexing sections (36) to accommodate future flexing and the height to accommodate future compression and tilt.

24 Claims, 10 Drawing Sheets

COMPLIANT THERMAL INTERFACE DEVICES AND METHOD OF MAKING THE DEVICES

This application claim benefit to provisional No. 60/169,937, filed Dec. 28, 1999.

CROSS-REFERENCE TO RELATED APPLICATIONS

Not Applicable

FEDERALLY SPONSORED RESEARCH OR DEVELOPMENT

Not Applicable

BACKGROUND OF THE INVENTION

The invention relates in general to conduction cooling of surfaces and in particular to conduction cooling of heat generating components, such as high power semiconductors and integrated circuits (IC's), where variations in gap distance and/or angular misalignment (tilt) between its surface and a cooling surface must also be accommodated. The invention may produce embodiments to interface between surfaces with various shapes, including, but not limited to: flat, two-dimensionally curved, three-dimensionally curved, cylindrical and tubular surfaces. The invention also relates to simple methods of making the devices.

Continuing demands in electronic technology of greater integration, faster operating speeds, greater output power, and reduced package size have increased the density of heat generation and magnified cooling requirements. Further, electronic components are often sealed in modules to protect them from liquid cooling systems or harsh environments. Manufacturing tolerances and thermal expansion properties of the various items along the thermal path, however, can combine to create conflicting thermal effects. Ignoring these effects can result in large mechanical stresses, inconsistent thermal contact, erratic functioning of the component, and premature component failure. A compliant, thermally conductive interface device is often needed between a heat generating component and a module cover plate or heat sink to accommodate manufacturing tolerances and thermal effects, reduce mechanical stresses, and provide consistent cooling performance. In addition, similar interface devices are often needed with components having curved or cylindrical surfaces, such as traveling wave tubes and heat pipes. Many designs have been developed to address these needs. A few of the more relevant designs are briefly described below.

U.S. Pat. No. 4,485,429, describes a plurality of thin wires anchored to a cover plate that press down onto a heat generating component causing the individual wires to bow in a springlike action to accommodate component height and tilt. Although each thin wire has high thermal resistance, filling the space above the component with a plurality of wires reduces the overall thermal resistance to a low level. Bowing of the wires, however, must be limited (approximately 0.13 mm compression) to retain elastic springback capability and prevent excessive spreading of the wire bundle in a fan-like (or broom-like) manner. Excessive fan-like spreading can reduce thermal contact efficiency between the ends of the wires and the component surface, and reduce wire density over the component. U.S. Pat. No. 4,156,458 describes a similar system using foils instead of wires. Straight foils are stacked against each other (without gaps) and bonded to a cover plate at an acute angle (45). Soldering the foils to a component surface (after fan-like spreading of the foil bundle) is also described to complement thermal contact. Soldering, however, stiffens the foils, increases resistance to further compression, and can impose lateral forces on the component due to the angular alignment of the foil bundle.

U.S. Pat. No. 4,993,482 describes the use of highly conductive springs laid on their sides. Every loop of the springs represents two wires thermally linking the component to the cover plate. Thermal performance is dependent on good thermal contact with the springs and the ability to fill the void between the component and the cover plate with thermal links. U.S. Pat. No. 4,156,458 also describes a similar system using a tubular roll of foil instead of a spring.

IBM Technical Disclosure Bulletin article entitled "LSI Cooling and Packaging Design" dated February, 1994, pages 99–100, and U.S. Pat. No. 5,528,456 describe other designs using corrugated sheets of highly conductive materials to interface between the component and the cover plate. The corrugations deform to accommodate height and tilt variations.

U.S. Pat. Nos. 5,557,501 and 5,650,914 describe a system where a plurality of foil cantilevers are fabricated on thermally conductive plates using conventional photolithography and etching techniques. The cantilevers are bonded between the plates to produce a plurality of short thermal links similar to the corrugations described previously. Half of the cantilevers are made in opposite lateral directions to substantially neutralize lateral forces on the component. Multi-layered cantilevers are also described. Their ability to fill the void between the component and the cover plate, however, remains lower than U.S. Pat. Nos. 4,485,429 and 4,156,458 described previously.

Similar interface devices for use between curved or cylindrical surfaces, such as traveling wave tubes and heat pipes, are described in U.S. Pat. Nos. 3,746,087 and 3,823,772. Cone-shaped structures, anchored circumferentially to the inside surface of a cylindrical cavity, are metallurgically bonded to a coaxially aligned cylindrical component producing a permanent installation. A design is also described that uses thin fins bonded tangentially to a cylindrical component. U.S. Pat. No. 4,358,707 describes a plurality of angled cantilevers machined into the outer surface of a cylindrical heat generating component.

Despite the wide variety of existing designs, a need continues for improved interface devices that provide high conduction cooling capabilities between two generally flat surfaces while accommodating a range of gap distances and angular misalignment (tilt) between the surfaces. A need also exists for similar devices to interface between curved or variously-shaped surfaces to provide similar benefits.

The present invention sets out to address these needs.

BRIEF SUMMARY OF THE INVENTION

According to one aspect of the invention there is provided an interface device, comprising:

at least one foil assembly, with each foil assembly comprised of a plurality of flexible foils, the foils extending between a first surface and a second surface and in a length direction along the surfaces, with each foil comprised of a proximal edge near the first surface, a flexing section, and a distal edge near the second surface, the foils within the foil assembly are stacked in a densely-packed, nested fashion with the proximal edges of adjacent foils distributed with a proximal edge spacing factor and the distal edges of adjacent foils distributed with a distal edge spacing factor so that interstitial separation distances are provided between the flexing sections of adjacent foils to accommodate flexing and compression of the distance between the first and second surfaces to a desired minimum for the foil assembly.

This invention also considers the interface device as defined above wherein the interstitial separation distances are generally depleted and the flexing sections of adjacent foils are generally against each other when the distance between the first and second surfaces is at the desired minimum for the foil assembly. This invention also considers the interface device as defined above wherein the relative spacing between adjacent proximal edges and the relative spacing between adjacent distal edges remains generally fixed during device operation. This invention also considers the interface device as defined above wherein the proximal edges of the foils are fixed by bonding the proximal edges of adjacent foils together, and/or by bonding the proximal edges to a common bonding surface such as a first member. The first member may be, for example, a heat generating component, a heat sink, a cover plate, or a collector plate. The bonded plurality of adjacent proximal edges, and/or the first member (with its bonds to the proximal edges of the foils) may also be flexible and deformable in a direction perpendicular to the foil length direction. This provides a capacity for the first surface of the foil assembly to bend and conform to a range of curved surfaces. This invention also considers the interface device as defined above wherein at least one of the first and second surfaces is(are) curved in a direction perpendicular to the foil length direction.

This invention also considers the interface device as defined above with the foil flexing sections further comprised of at least one bend. This invention also considers the interface device as defined above where the surfaces of the foils, excluding the proximal and distal edges, are coated.

This invention also considers the interface device as defined above further comprising a means for increasing springback to exert added force on the foil assembly to extend the distance between the first and second surfaces. The means for increasing springback may comprise helical springs, foil-shaped springs or foil-shaped spring assemblies. Pluralities of both elastically deformable foils and elastoplastically deformable foils may be combined in one interface device to provide both thermal performance and springback.

According to a further aspect of the invention there is provided a method of making an interface device, comprising the steps of:

pre-forming a plurality of flexible foils in a shape generally similar to their shape in a foil assembly when the distance between a first surface and a second surface is a desired minimum, and each foil being comprised of a proximal edge near the first surface, a flexing section and a distal edge near the second surface;

stacking the plurality of foils in a densely-packed, nested fashion;

fixing the relative spacing between adjacent foil distal edges and fixing the relative spacing between adjacent foil proximal edges;

extending the distance between the first surface and the second surface.

This intention also considers the method of making an interface device as defined above wherein the foils are stacked in a densely-packed, nested fashion with the flexing sections of adjacent foils directly against each other.

According to a further aspect of the invention there is provided a further method for manufacturing an interface device, comprising the steps of:

pre-forming a plurality of flexible foils in a shape generally similar to their shape in a foil assembly when the distance between a first surface and a second surface is greater than a desired minimum, and each foil comprised of a proximal edge near the first surface, a flexing section and a distal edge near the second surface;

stacking the plurality of foils in a densely-packed, nested fashion between at least one proximal die and at least one distal die, with the proximal die(s) having a surface generally similar in shape to the desired shape for the first surface and the distal die(s) having a surface generally similar in shape to the desired shape for the second surface and the foils extending generally between the proximal and distal dies;

compressing the plurality of foils between the proximal and distal dies and allowing the stack of foils to spread out and the foils to deform until the distance between the first surface and the second surface is a desired minimum;

fixing the relative spacing between adjacent foil distal edges and fixing the relative spacing between adjacent foil proximal edges produced when the distance between the first surface and the second surface is at the minimum; and extending the foil assembly by extending the distance between the first surface and the second surface.

This invention also considers the method of making an interface device as defined above wherein the flexing sections of adjacent foils directly against each other when fixing the foil edges.

According to a further aspect of the present invention there is provided a tubular interface device, comprising:

at least one foil assembly, with each foil assembly comprised of a plurality of flexible foils, and the foils extending generally parallel to the central axis of the device and extending between a tubularly-shaped first surface and a tubularly-shaped second surface, and each foil comprised of a proximal edge near the tubularly-shaped first surface, a flexing, section with at least one bend, and a distal edge near the tubularly-shaped second surface, and the foils within at least one of the foil assemblies are stacked in a densely-packed, nested fashion, with the distal edges of adjacent foils distributed with a distal edge spacing factor and generally fixed relative to each other, and the proximal edges of adjacent foils distributed with a proximal edge spacing factor and generally fixed relative to each other, and the spacing factors providing interstitial separation distances between the flexing sections of adjacent foils to accommodate deformation and compression of the foils and a reduction in the distance between the tubularly-shaped first and second surfaces to a desired minimum for the foil assembly.

This invention also considers the interface device as defined above wherein the tubularly-shaped first surface is not continuous, the first surface being comprised of at least one split extending generally parallel to the central axis of the device for its entire length, and proximal edges of foils on opposite sides of the split(s) are not fixed relative to each other, so as to allow expansion in the general diameter of the tubularly-shaped first surface. This invention also considers the interface device as defined above further comprising a tubularly-shaped proximal collector plate, the proximal collector plate being comprised of at least one split extending parallel to its central axis and for its entire length, and proximal edges of foils on opposite sides of the split(s) are not fixed relative to each other. This invention also considers the interface device as defined above wherein the interstitial separation distances are generally depleted and the flexing sections of adjacent foils within a foil assembly are generally against each other when the distance between the tubularly-shaped first surface and the tubularly-shaped second surface is a desired minimum for the foil assembly. This invention also considers the interface device as defined above further comprising a means for increasing springback such as at least one garter spring.

According to a further aspect of the present invention there is provided a tubular interface device, comprising:

an outer shell;

at least one foil bundle, with each foil bundle comprised of a plurality of flexible foils, and each foil comprised of a proximal edge near an inner tubularly shaped surface, a flexing section, and a distal edge near the outer shell, the foils within at least one of the foil bundles are stacked in a densely-packed, nested fashion, with the stack extending generally parallel to the axis of the device, with each foil bundle compressible from a smaller radial distance from the central axis of the device to a larger radial distance, and the proximal edges of adjacent foils within a foil bundle generally fixed at a proximal edge spacing factor to each other and the distal edges of adjacent foils within a foil bundle generally fixed at a distal edge spacing factor to each other and the distal edges fixed to the outer shell, so that interstitial separation distances are provided between the flexing sections of adjacent foils to accommodate flexing and compression of the distance between the inner tubularly-shaped surface and the outer shell to a desired minimum for the foil bundle.

This invention also considers the interface device as defined above wherein the flexing sections of adjacent foils are generally against each other and the interstitial separation distances are depleted when the distance between the inner tubularly-shaped surface and the outer shell is at the desired minimum for the foil bundle. This invention also considers the interface device as defined above wherein the proximal edges of the foils within a foil bundle are bonded to a first member. This invention also considers the interface device as defined above further comprising a means for increasing springback.

BRIEF DESCRIPTION OF THE DRAWINGS

The invention, as exemplified by the embodiments, is described with reference to the drawings in which.

DETAILED DESCRIPTION OF THE INVENTION

Figure 1A:
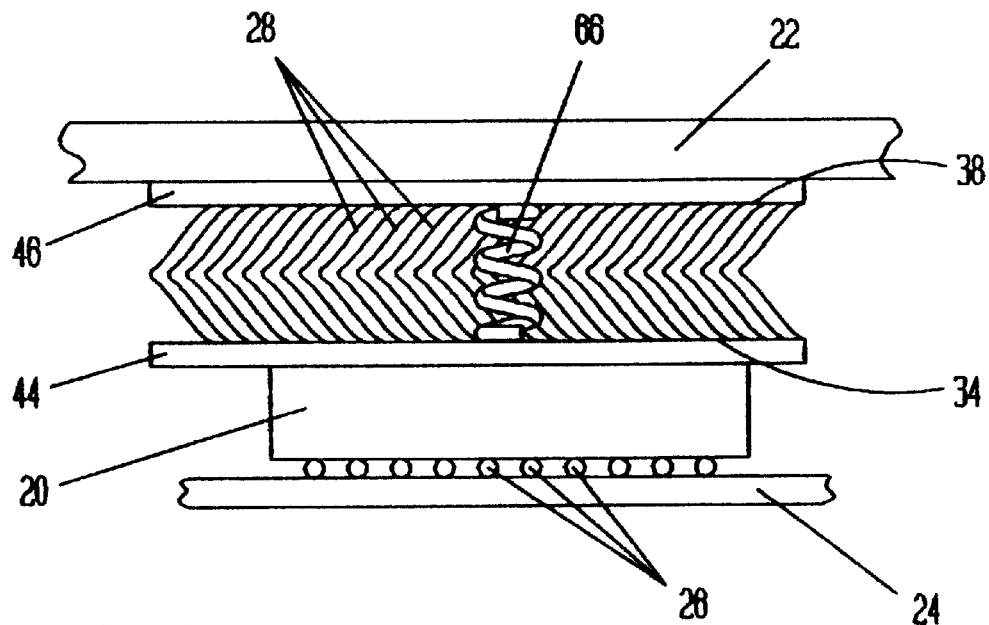
FIG. 1a and FIG. 1b show a front and side view of an aspect of an embodiment of the invention installed between an electronic component and a cover plate.
Figure 1B:
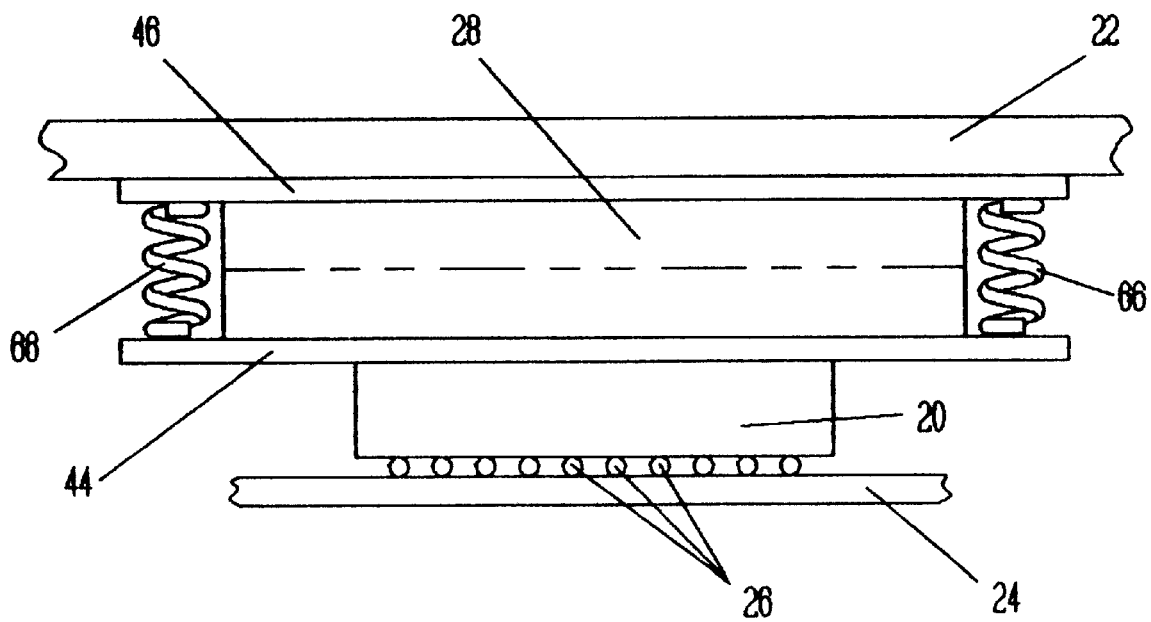

In FIG. 1a and FIG. 1b, a front and side view of an embodiment of the present invention is shown inserted between a flat heat generating component 20 and a cover plate 22. The heat generating component is shown attached to a printed circuit board 24 by solder bonds 26. The invention may be used to interface between two flat surfaces to accommodate a gap distance and angular misalignment (i.e., tilt) between the surfaces and simultaneously provide a thermal bridge of low resistance between the surfaces. Other embodiments of the invention may be used between non-flat surfaces and will be described subsequently in greater detail. The invention may be bonded to the cover plate 22 and/or heat generating component 20 by, for example, but not limited to, soldering. Alternatively, contact with the cover plate and/or heat generating component may be complemented with a thermally conductive material. For example, a conventional thermal grease or compound may be used to allow removal of the cover plate for component testing and replacement.

Figure 2A:
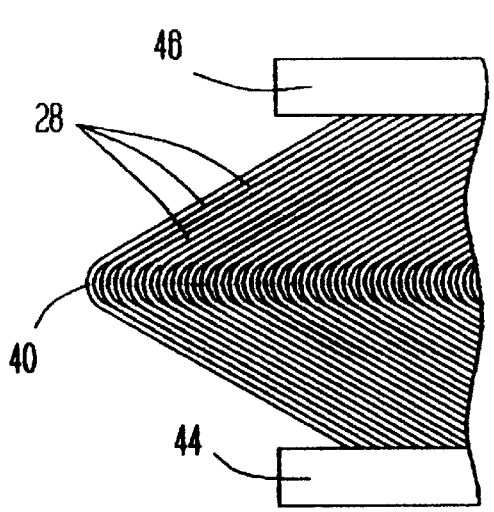
FIG. 2a shows an aspect of an embodiment of the invention with the foils fully compressed (i.e., at minimum gap height). Foil thickness has been exaggerated, relative to the other parts of the embodiment, for better detail.
Figure 2B:
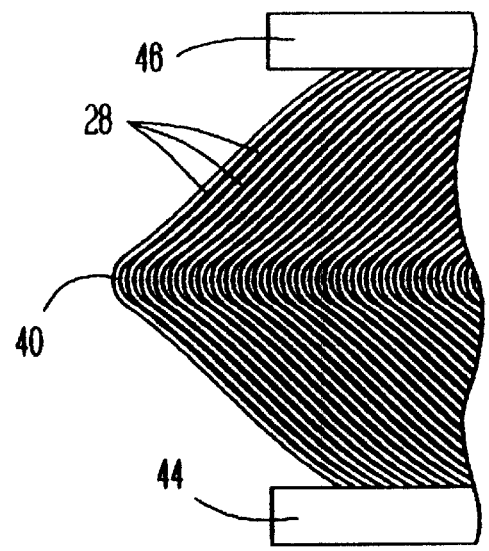
FIG. 2b shows the embodiment shown in FIG. 2a with the foils at a different compression height (i.e., device at a larger gap distance).
Figure 4A:
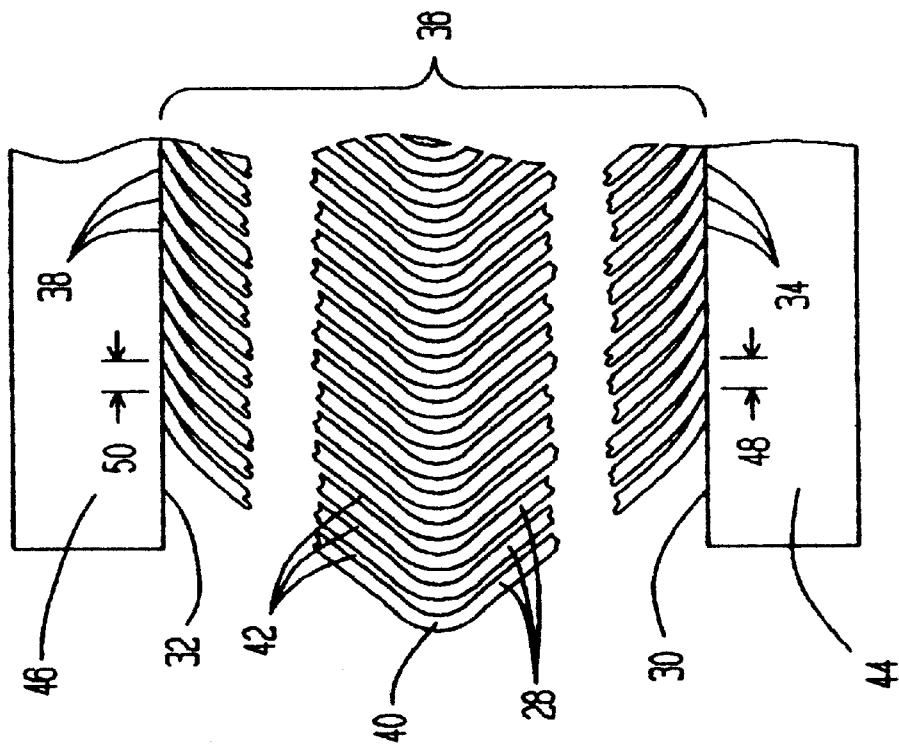
FIG. 4a and FIG. 4b are detailed drawings of an aspect of an embodiment showing the various parts of the foils and the interstitial separation distances between the flexing sections of adjacent foils. Foil thickness has been exaggerated, relative to the other parts of the embodiment, for better detail.
Figure 4B:
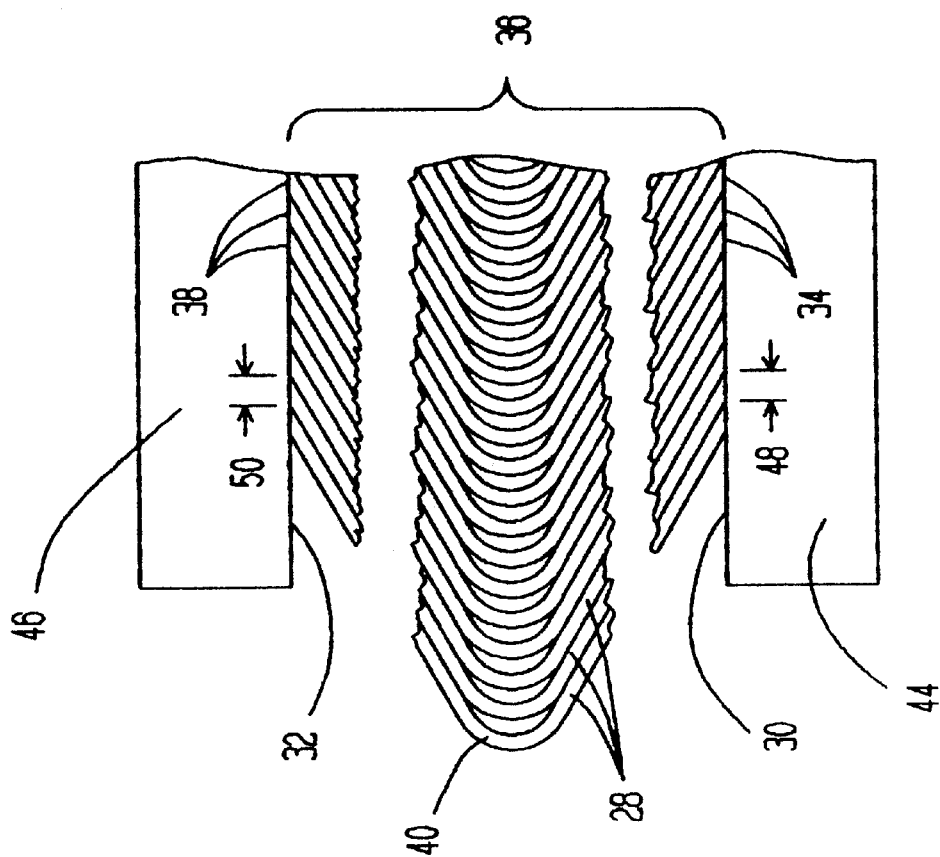
Figure 5A:
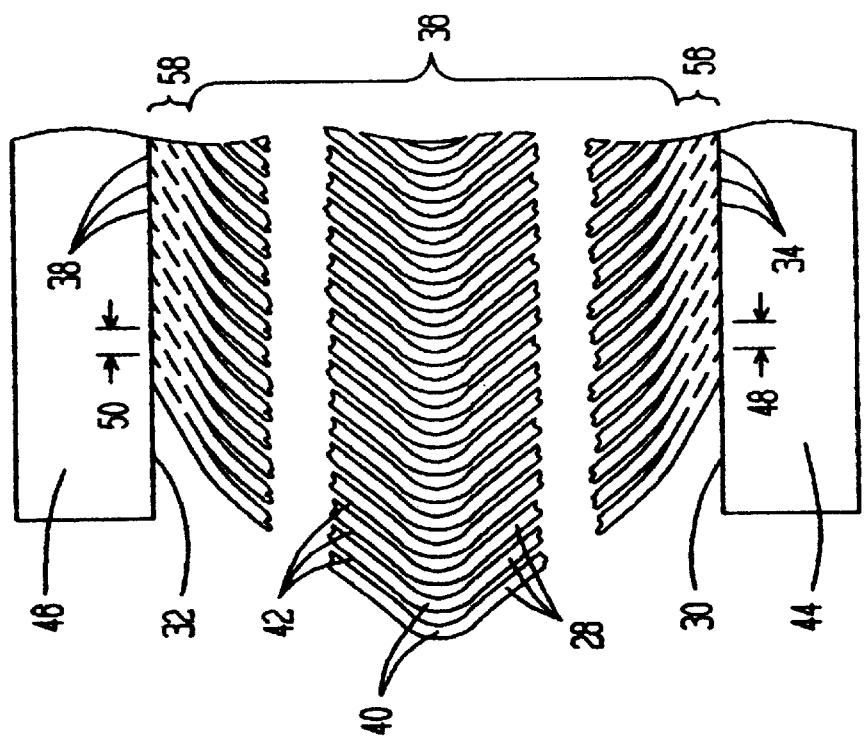
FIG. 5a and FIG. 5b are detailed drawings similar to FIG. 4a and FIG. 4b showing adjacent foil edges bonded together and bonded to collector plates.

An interface device of the present invention may be comprised of one or more assemblies of flexible foils. FIG. 2a and FIG. 2b show a more detailed view of one aspect of an embodiment of the invention with the thickness of the foils exaggerated relative to other parts of the device. Each foil assembly may be comprised of a plurality of foils 28 extending between a first surface 30 and a second surface 32 (FIG. 4a, FIG. 4b). Foil thickness compared to the distance between the first and second surfaces may be, for example, but not limited in any manner to, less than 0.005. The foils, in an assembly, are stacked in a densely-packed, nested fashion. The flexible foils may be made of highly conductive materials, for example, but not limited to, aluminum, copper or their alloys. Each foil may be comprised of a proximal edge 34 near first surface 30, a flexing section 36, and a distal edge 38 near second surface 32 (FIG. 4a and FIG. 4b). The flexing section 36 may also be comprised of one or more bends 40. The radii of the bends 40 may be selected to exceed the minimum required for fatigue resistant bending. For a foil assembly with generally flat, parallel first and second surfaces, the flexing section of each foil is preferably comprised of one centrally-located bend 40 and the line extending between the distal 38 and proximal 34 edges of each foil is generally perpendicular to the first 30 and second 32 surfaces (FIG. 2a, FIG. 4a and FIG. 5a).

The ability of an embodiment of the present invention to perform within a typical installation and to provide a low resistance thermal bridge between two flat surfaces while accommodating a range of gap distances and angular misalignment (tilt) between the surfaces may be influenced by many factors, including: the maximum compression force, the quantity, shape, thickness, distribution, thermal and deformation properties of the foils, the strength and thermal properties of the bonds to the foils, and springback. Some of these factors will be described in greater detail below.

Comparing FIG. 4a and FIG. 4b, or FIG. 5a and FIG. 5b, shows that vertical compression of the foils causes their flexing sections 36 to deform. The deformed flexing sections 36 take up more lateral space and reduce their interstitial separation distances 42. Without interstitial separation distances 42, adjacent flexing sections are directly against each other (FIG. 4a) and must push each other away to create sufficient space to accommodate further compression. With the foil edges bonded, compression is strongly resisted. With both foil edges free to move, pushing between adjacent flexing sections can cause the proximal 34 and distal 38 edges of the foils to slide against their mating surfaces and the foil assembly to spread out. When mounted over a component, however, spreading of the foil assembly can cause variations in thermal performance.

Foils 28 may be distributed so that sufficient interstitial separation distances 42 are provided between the flexing sections 36 of adjacent foils to allow compression of the distance between the first 30 and second 32 surfaces of the foil assembly to a desired minimum without forcing the edges of adjacent foils to slide away from each other causing the foil assembly to spread out. The proximal edges 34 of the foils may remain distributed with a proximal edge spacing factor 48, and the distal edges 38 of the foils may remain distributed with a distal edge spacing factor 50, throughout the desired foil compression range. Further, proximal and distal edges may be held generally fixed at these relative spacings by several means including attachment or bonding. The proximal edges 34 of the foils within a foil assembly may be bonded to a common bonding surface, such as a first member 44, and the distal edges 38 of the foils may be bonded to another common bonding surface, such as a second member 46. More consistent thermal performance may be produced throughout the range of gap distances for the embodiment. Metallurgical bonding may be done to also provide a thermally conductive medium to further complement thermal contact. Bonding of the foil edges (34 and 38) may be done by, for example, but not limited to, fluxless soldering, brazing, or welding. With the foil edges bonded, full compression of the foils may occur when the flexing sections 36 of adjacent foils are directly against each other and further compression is strongly resisted (FIG. 4a). Preferably, full compression of the foils may be designed to coincide with, or occur slightly below, the minimum gap distance for the interface device.

For a foil assembly with flat first 30 and second 32 surfaces and a plurality of identical foils, proximal edge spacing factor 48 and distal edge spacing factor 50 may be equal and constant. Other embodiments of the invention, however, may use proximal edge and distal edge spacing factors that are different to produce non-flat first and second surfaces. The spacing factors may also be dependent on the positions of the foil edges along the first and second surfaces to accommodate variously-shaped first and second surfaces, such as, but not limited to, curved, arced, elliptical or tubular surfaces and will be described in greater detail subsequently. Similarly, foils with different heights may be distributed within a foil assembly to produce curved first and/or second surfaces and will also be described subsequently in greater detail.

The first 44 and second 46 members may be used as common bonding surfaces for the foil edges. The first and second members may be, for example, a heat generating component, cover plate, or heat sink. Alternatively, collector plates (44 and 46, FIG. 1a, FIG. 1b) may be used as first and second members to provide common bonding surfaces for the foils without the need for bonding to a heat generating component and cover plate. Further, collector plates help disperse heat and may present surfaces to the heat generating component and cover plate with different properties compared to the plurality of foil distal 38 and proximal 34 edges.

Preferably, the foil edges (34, 38) are bonded to first 44 and second 46 members when the flexing sections 36 of adjacent foils are directly against each other (with no significant interstitial separation distances 42, FIG. 4a and FIG. 5a), corresponding to full compression of the foil assembly. Extending the distance between the first and second surfaces (after bonding the foil edges) from the full compression height to the maximum for the compression range, introduces interstitial separation distances 42 between the flexing sections 36 of adjacent foils (FIG. 4b). Future compression of the foil assembly may be accommodated down to the minimum gap distance of the interface device and/or the full compression height of the foil assembly (FIG. 4a).

Figure 5B:
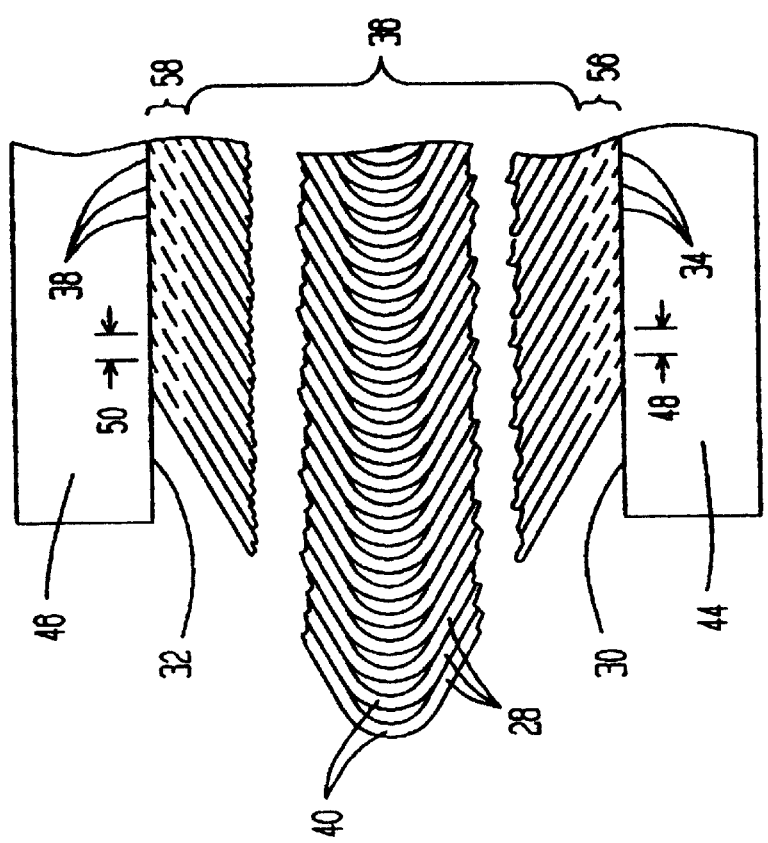

Alternatively, with the flexing sections 36 of adjacent foils directly against each other and the general shape of the flexing sections extended to the foil edges (34, 38) so that the edges of adjacent foils are side by side, adjacent foils may be bonded together near their distal edges 38 to produce a distal layer 58 (comprised of the bonded plurality of adjacent foil distal edges) and bonded together near their proximal edges 34 to produce a proximal layer 56, as shown in FIG. 5*a*. Bonding adjacent foil edges together may be done to eliminate the need for common bonding surfaces, such as collector plates (44 and 46). Collector plates, however, may also be bonded onto the proximal 56 and distal 58 layers (FIG. 5*a*, FIG. 5*b*).

Figure 6A:
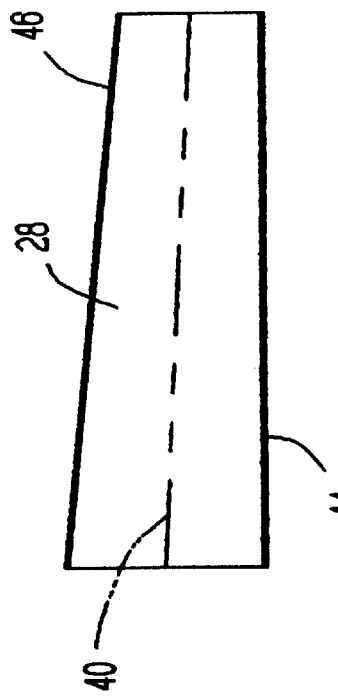
FIG. 6a and FIG. 6b show possible shapes for an embodiment of the invention when accommodating non-parallel surfaces (i.e., a tilted surface) in two different orientations.
Figure 6B:
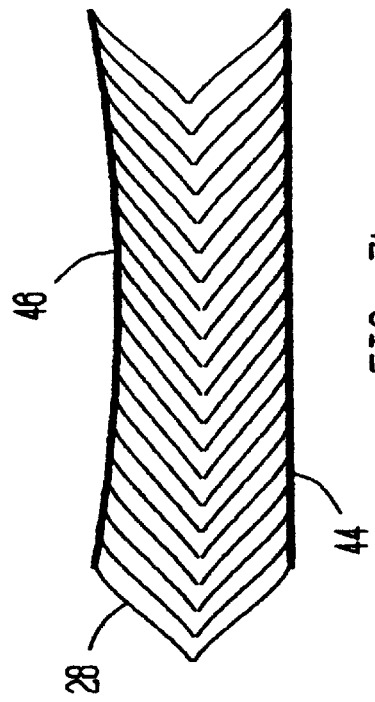

It can be seen from FIG. 6*a*, FIG. 6*b* and FIG. 4*b*, that tilting of one end of the top or distal collector plate 46 causes one end of the embodiment to be more compressed compared to the other. The interstitial separation distances 42 between adjacent flexing sections 36 provide a capacity to accommodate slightly different compression heights on adjacent foils. For a densely-packed foil assembly, shown in FIG. 6*a* and FIG. 6*b* and in greater detail in FIG. 2*a* and FIG. 2*b*, the foil assembly may generally accommodate flat tilts within its compression range.

Figure 3A:
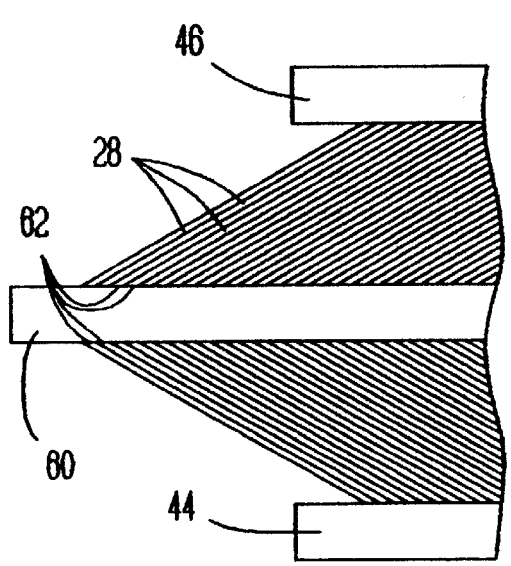
FIG. 3a and FIG. 3b show an aspect of an embodiment of the invention similar to the embodiment shown in FIG. 2a and FIG. 2b but with two pluralities of generally straight foils bonded to an intermediate collector plate instead of one plurality of bent foils.
Figure 3B:
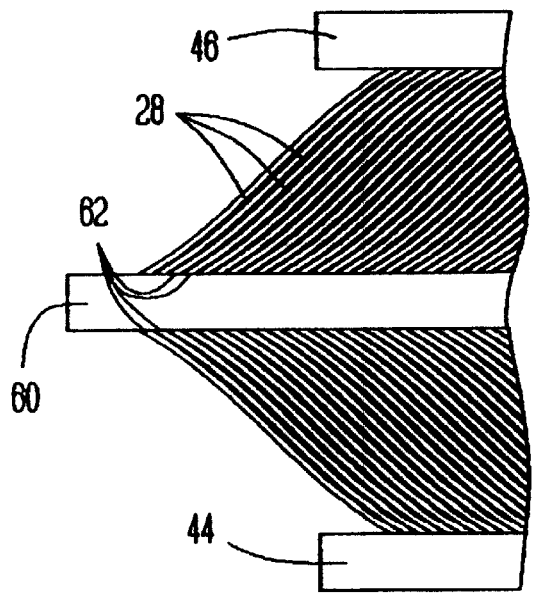

Although the preferred foil profile shape, shown in FIG. 2*a* and FIG. 2*b*, is comprised of a central bend 40, foils with generally straight but angled flexing sections when fully compressed may also be used (FIG. 3*a*). Generally straight but angled foils, however, may be more limited in accommodating tilt and may cause lateral movement of their proximal edges relative to their distal edges when compressed. The embodiment shown in FIG. 3*b* has a similarly looking structure to that shown in FIG. 2*b*, and can accommodate a generally similar range of gap distances, if the proximal and distal collector plates (44 and 46) of the embodiment are parallel (i.e., no tilt). Centrally-disposed foil edges 62, however, are bonded to an intermediate collector plate 60 and are not free to move relative to each other as compared to the corresponding central bend portions 40 of adjacent flexing sections 36 shown in FIG. 2*b*, FIG. 4*b* and FIG. 5*b*. With tilting of the distal or proximal collector plate (46 or 44), intermediate collector plate 60 experiences vertical and lateral forces from all the foils bonded to it. Its final position is the result of all these forces. Each foil must not only deform to accommodate the tilt on the embodiment but also the resulting position and orientation of the intermediate collector plate 60. In this way, the generally straight foil shape, shown in FIG. 3*a* and FIG. 3*b*, may be more limited in tilt capability in comparison to the preferred foil shape shown in FIG. 2*b*, FIG. 4*b* and FIG. 5*b*.

The ability to stack a plurality foils in a densely-packed, nested fashion, as shown in FIG. 2*a*, FIG. 2*b*, FIG. 4*a*, FIG. 4*b*, FIG. 5*a*, and FIG. 5*b*, with the minimum interstitial separation distances 42 between adjacent foil flexing sections 36 to accommodate a desired fully compressed height and minimum gap distance may be, to a large degree, independent of foil thickness. A smaller quantity of thicker foils or a larger quantity of thinner foils may be used to fill a given space. Thinner foils may be used to provide several benefits, including; increased flexibility and reduced compression force for the foil assembly. The space between the first 30 and second 32 surfaces may remain significantly filled with thin foils and still provide sufficient room for foil flexing to accommodate a significant range of gap distances and tilts.

Although the individual foils may be thin, a densely-packed foil assembly, with both the distal 34 and the proximal edges 38 of the foils bonded, may be considerably more robust and capable of tolerating typical handling involved in subsequent installations. In addition, since each foil may represent a small fraction of the total number of foils, a range of foil-to-foil thicknesses and/or properties may be accommodated while achieving a desired performance.

Foil dimensions and foil material may be selected so that foil compression produces, for example, elastic-only stressing in the foils or elastoplastic stressing. Foils based on elastic-only deformation experience elastic stress generally in proportion to the amount deformation sustained. As the compression is removed, the elastic deformation is recovered resulting in springback to their initial shape. Large elastic deformation, however, may generate large stresses which must be sustained by both the foil material and the bonds to the foils. Using thinner foils, as described previously, reduces the stress level for a given amount of deformation and results in greater flexibility compared to thicker foils.

Elastoplastic deformation may involve stressing beyond the elastic range of a material to produce plastic deformation. Foils made of a "weaker" elastoplastic material may experience a smaller elastic range that ends at a lower stress level compared to a similar embodiment based on elastic-only stressing. Significant deformation beyond the elastic range may result in a disproportionally small increase in the lower stress level. Foils made of a "weaker" elastoplastic material may be more compliant, may experience lower stresses in both the foils and their bonds, and may require a lower compression force compared to foils based on elastic-only stressing. Plastic deformation, however, is non-recoverable and springback generated by the foils is limited to the elastic portion of the total elastoplastic deformation. Using thinner foils, as described previously, reduces stresses, allows more flexing before exceeding the elastic range, and results in greater springback compared to thicker foils.

Springback is often required to track changes in the gap distance or gap tilt (thermally induced or otherwise) to prevent the loss of thermal contact. Required springback, however, may be significantly smaller than the total range of gap distances for a device and may be dependent on the particular application. Required springback (generated by an interface device) may vary from 0%, when an interface device is bonded to both the heat generating component and the cover plate, to 100% when an interface device must springback independently to its stated maximum gap distance.

Means for increasing springback may be used to assist the springback from the foils. Means for increasing springback may comprise, for example, helical springs 66, as shown in FIG. 1*a* and FIG. 1*b*. Alternatively, means for increasing springback may comprise foil-shaped springs or foil-shaped spring assemblies. The springs may be made of materials with high elastic strengths but poor thermal conductivities. Foil-shaped spring assemblies may be sandwiched between adjacent elastoplastic foil assemblies to produce an interface device with distributed means for increasing springback. Means for increasing springback may be used to compensate for the poor elastic properties, and/or other relevant properties (e.g., stress relaxation) of many highly conductive materials such as, for example, high-purity aluminum and high-purity copper.

Additionally, elastic-only deformable foils or foil assemblies and elastoplastically deformable foils or foil assemblies may be used in one interface device (with or without means for increasing springback) to provide a highly conductive interface device that can accommodate a large range of gap distances.

A further aspect of the invention is the ability to use foils with a coating on their major surfaces, excluding the distal and proximal edges. A suitable coating may be used for environmental protection or other reasons. The coating material, however, must be compatible with the means for fixing or bonding the foil edges. For example, a coating material compatible with high temperature soldering may be used on foils to be soldered to first and second members.

Figure 7A:
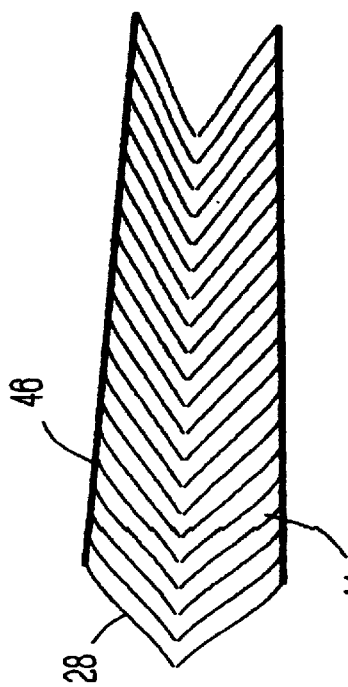
FIG. 7a shows a possible shape for an embodiment of the invention when accommodating a concave surface perpendicular to the foil length direction.
Figure 7B:
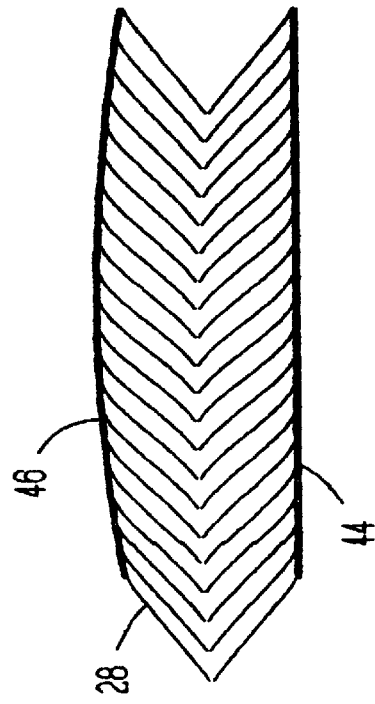
FIG. 7b shows a possible shape for an embodiment of the invention when accommodating a convex surface perpendicular to the foil length direction.

A further aspect of the invention is shown in FIG. 7a and FIG. 7b where the first and second surfaces of a foil assembly may be flexible and bend to accommodate slight curvatures. This may be done by producing thin, flexible proximal 56 and distal 58 layers (FIG. 5a, FIG. 5b), and/or using thin and flexible collector plates (44 and 46) and minimizing the thickness of their bonds with the foil edges (38 and 34, FIG. 4a, FIG. 4b). Bending of these regions, however, is generally limited to two-dimensional curvature in a direction perpendicular to the foil length due to the stiffening effect of the bonded foils. For FIG. 7a, and FIG. 7b, the foil length direction is into the page. Flat tilting of the surfaces may be accommodated in either direction (FIG. 6a, FIG. 6b). The bonds to the foil edges generally maintain the relative edge spacing factors (48, 50 FIG. 4b, FIG. 5b) but now allow the edges of the foils to bend or rotate in cooperation with adjacent foil edges and/or in cooperation with the flexible collector plates 44 and 46.

Figure 8:
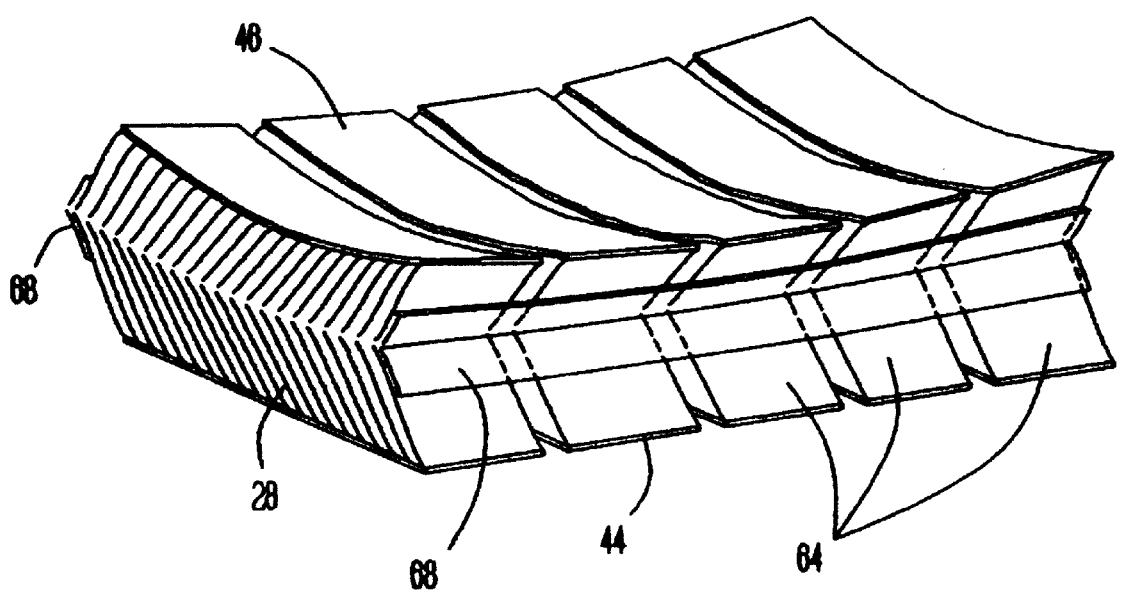
FIG. 8 shows an isometric view of an aspect of an embodiment of the invention in a possible shape when accommodating a surface with three-dimensional curvature.

An embodiment with better three-dimensional compliance may be produced using at least two subassemblies 64, with each subassembly comprised of flexible first and second surfaces, similar to that described previously, with foils of shorter length. The subassemblies 64 may be aligned such that an equivalent total foil length is produced, as shown in FIG. 8. The flexible proximal and distal layers, and/or flexible collector plates of each subassembly, may tilt independently in the foil length direction and bend in a perpendicular direction. The subassemblies 64 may be linked by two resilient strips 68 bonded to the first and last foils of the subassemblies to retain the subassemblies together. By decreasing the foil lengths of each subassembly, each subassembly is exposed to a smaller section of curvature (in the foil length direction) resulting in greater conformance capability.

Figure 9A:
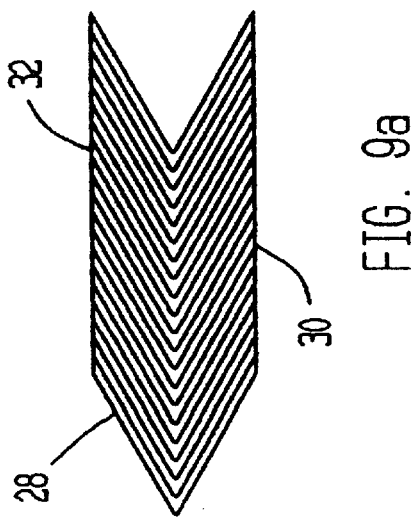
FIG. 9a, FIG. 9b and FIG. 9c show a plurality of bent foils stacked in a densely-packed, nested fashion before and after machining the second surface to produce a curved surface, and after extending the foils.
Figure 9B:
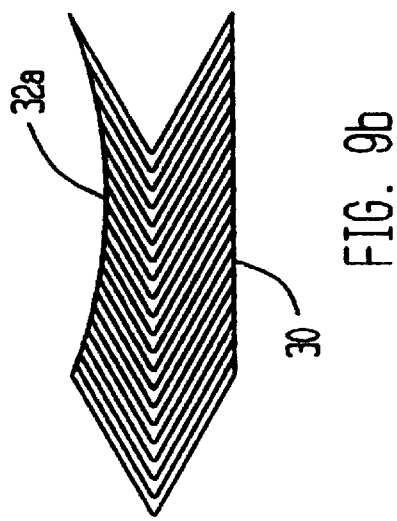
Figure 9C:
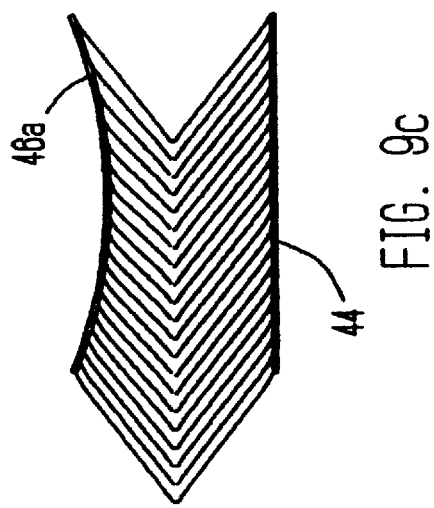

A further aspect of the invention is the capability to machine or trim a plurality of foils when stacked in a densely-packed, nested fashion (FIG. 9a) to produce curved first and/or second surfaces (32', FIG. 9b and FIG. 9c). The first and second surfaces may also be flexible and bend to accommodate deviations from the desired curvature, as described previously. The distal edges of the foils of the embodiment shown in FIG. 9c are bonded to a curved, flexible distal collector plate 46a.

Figure 10A:
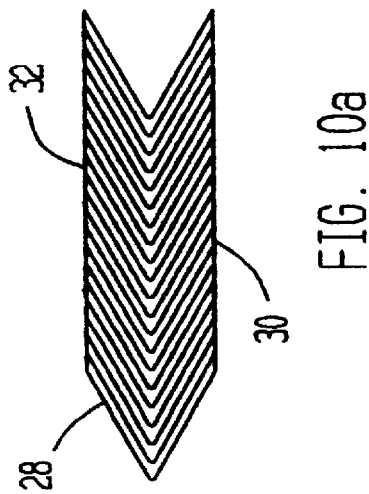
FIG. 10a, FIG. 10b, FIG. 10c show an aspect of an embodiment of the invention similar to that shown in FIG. 9a, FIG. 9b and FIG. 9c but with a foil assembly with generally flat first and second surfaces and a distal collector plate with a curved outer surface.
Figure 10B:
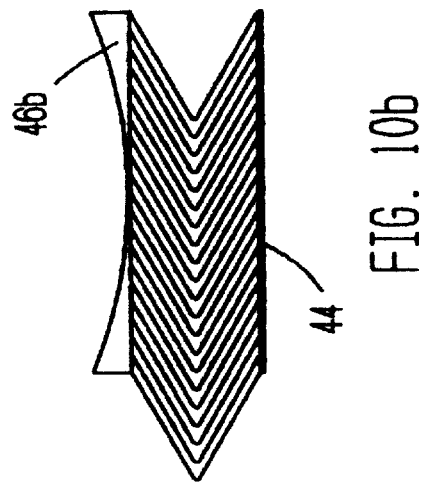
Figure 10C:
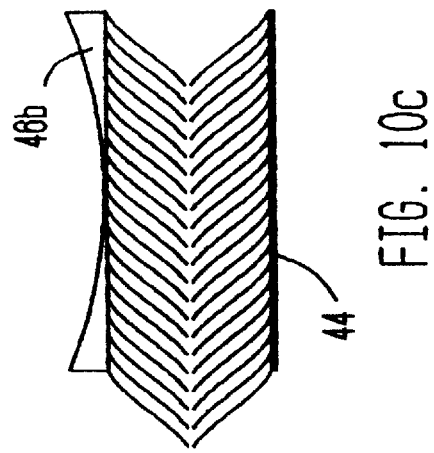

Alternatively, a foil assembly with flat first and second surfaces (30, 32, FIG. 10a) may be bonded to collector plates with variously-shaped outer surfaces 46b, to produce embodiments with predefined curved surfaces (e.g., FIG. 10b, FIG. 10c).

A still further aspect of the invention is the capability to use a proximal edge spacing factor 48 that is different from the distal edge spacing factor 50. In this way, embodiments with curved first 30' and second 32' surfaces may be produced using a plurality of initially identical foils. The edge spacing factors may be constant or may be dependent on the positions along the first and second surfaces to produce variously-shaped first and second surfaces, such as, but not limited to, curved, arced, or elliptical shapes.

The invention may also produce tubular embodiments with cylindrical surfaces. The surfaces may form, for example, but not limited in any manner to, circular or elliptical cross-sectional shapes. Tubular embodiments may be used to accommodate coaxial misalignment between cylindrical heat generating components and heat sinks (FIG. 12c, FIG. 13c, FIG. 14c), and/or a range of component diameters (FIG. 15c, FIG. 16c) while providing high conduction cooling capabilities. The following descriptions for tubular embodiments of the invention are for example purposes. The descriptions, however, may also apply for other embodiments of the invention with other surface cross-sectional shapes.

Figure 11:
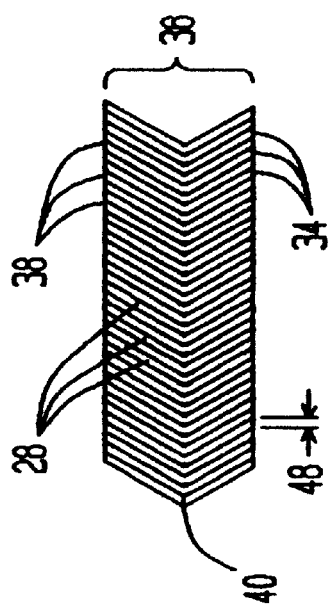
FIG. 11 shows a plurality of bent foils stacked in a densely-packed, nested fashion prior to incorporation into the tubular embodiment of FIG. 12a. Foil thickness is exaggerated, relative to the other parts of the embodiment, for better detail.
Figure 12C:
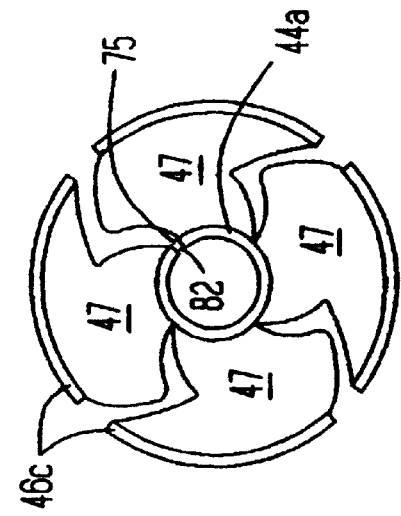
FIG. 12c shows an end view of the tubular embodiment shown in FIG. 12b but with the four distal collector plates extended radially outward to extend the foils.
Figure 13C:
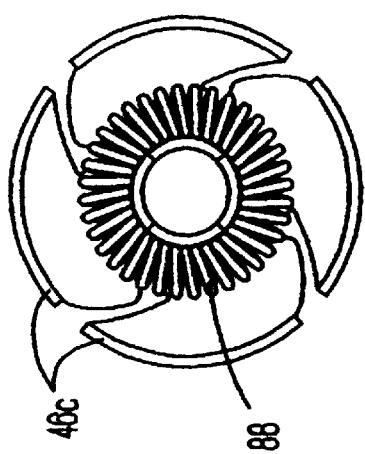
FIG. 13a, FIG. 13b and FIG. 13c show a tubular embodiment similar to that shown in FIG. 12b and FIG. 12c, using four proximal collector plates instead of one, and a garter spring for springback.
Figure 14C:
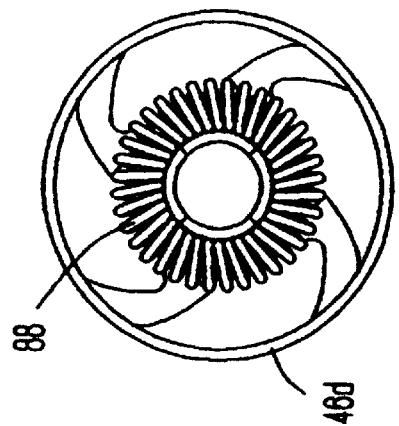
FIG. 14a, FIG. 14b and FIG. 14c show a tubular embodiment similar to that shown in FIG. 13a, FIG. 13b and FIG. 13c, but with a tubularly-shaped distal collector plate (without a split) and the foils extended inwardly to produce the interstitial separation distance between adjacent foils.

Tubular embodiments of the present invention may be produced with foils extending generally parallel to the central axis and curvature perpendicular to foil length, as shown in FIG. 12c, FIG. 13c and FIG. 14c. The thickness of the foils shown in the drawings for the tubular embodiments have been exaggerated, relative to the other parts, for better detail. Foil thickness compared to the distance between the curved first 30' and second 32' surfaces may be, for example, but not limited in any maimer to, less than 0.005. The tubular embodiments may be comprised of one or more densely-packed foil assemblies 47. The foils may be initially stacked in a linear, densely-packed, nested fashion with the flexing sections 36 of adjacent foils directly against each other and with an edge spacing factor generally equal to the minimum edge spacing factor expected for the tubular interface device (FIG. 11). The foils may then be trimmed or machined as a unit. The quantity, height, thickness and shape of the foils may be influenced by the maximum and minimum distance and space desired between the curved first 30' and second 32' surfaces.

Figure 12B:
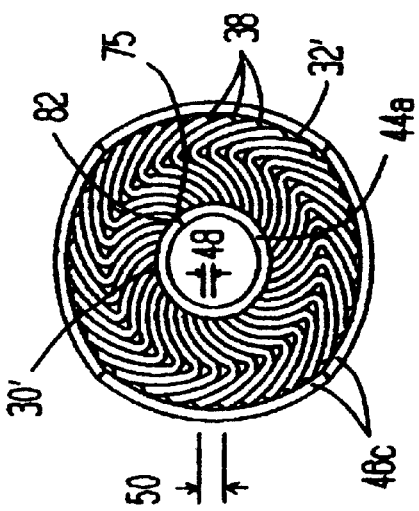
FIG. 12b shows a similar view to FIG. 12a but without the dies.
Figure 12A:
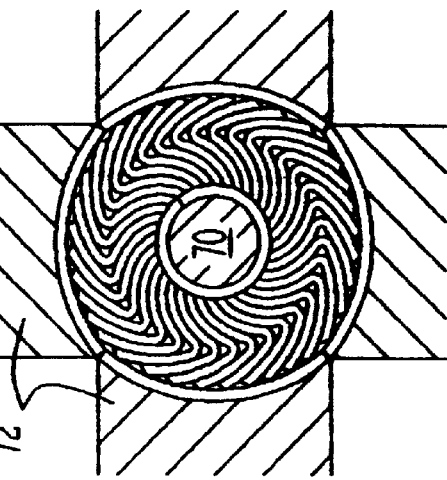
FIG. 12a shows an end view of a plurality of foils compressed between a proximal die and four distal dies.

The foils may be inserted between one or more proximal dies 70 and one or more distal dies 72 (FIG. 12a). One or more curved proximal collector plates (44a FIG. 12b, or 44b FIG. 13a and FIG. 14a) and one or more curved distal collector plates (46c FIG. 12b and FIG. 13a, or 46d FIG. 14a) may be used as common bonding surfaces for the foil edges. Proximal dies 70 and/or proximal collector plates 44a, 44b may have a surface curvature similar to the desired curvature for first surface 30'. Similarly, distal dies 72 and/or distal collector plates 46c, 46d may have surface curvature similar to the desired curvature for second surface 32'. The space between the first and second surfaces may then be compressed to the desired full compression height. Compression causes the foils to press directly against each other causing adjacent foils to spread out and conform to the space available. The proximal edge spacing factor 48 and the distal edge spacing factor 50 may change from their initial values in the linear stack (FIG. 11, FIG. 12b). With the foils compressed, the proximal edges of adjacent foils within a foil assembly may be bonded together (producing proximal layer 56 as in FIG. 5b) and/or bonded to a common bonding surface such as one curved proximal collector plate (44a FIG. 12b, or 44b FIG. 13a and FIG. 14a). The distal edges 38 of adjacent foils in a foil assembly may be bonded together (producing distal layer 58 as in FIG. 5b) and/or bonded to a common bonding surface such as one curved distal collector plate (46c FIG. 12b and FIG. 13a, or 46d FIG. 14a). One or more foil assemblies may be required to surround the tubular first surface.

Preferably, the tubularly-shaped first surface 30' is not continuous to allow expansion of its general diameter with insertion of a heat generating component with a larger diameter. The first surface may be comprised of at least one split 75 extending generally parallel to the central axis of the device for its entire length. The proximal edges of foils on opposite sides of the split(s) are not fixed relative to each other to allow expansion in the general diameter of the tubularly-shaped first surface. Similarly, a tubularly-shaped proximal collector plate may not form a continuous tube. A tubularly-shaped proximal plate 44a may be comprised of one split 82 (FIG. 12b, FIG. 12c) or several shorter proximal plates 44b may be used (similar to one tubularly-shaped proximal collector plate with several splits, FIG. 13b, FIG. 14b). A tubularly-shaped distal collector plate 46d may be used and may be continuous (unsplit) as shown in FIG. 14a, FIG. 14b, and FIG. 14c. Preferably, four or more curved distal collector plates 46c, four or more curved proximal collector plates 44b, and four or more foil assemblies 47 are used (FIG. 13a, FIG. 13b, FIG. 13c).

Figure 13B:
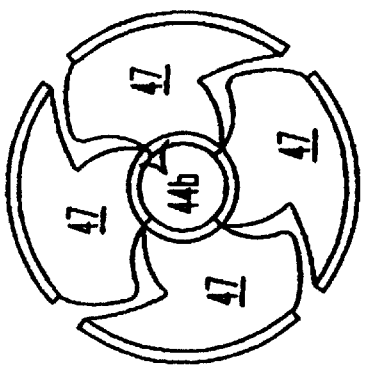
Figure 14B:
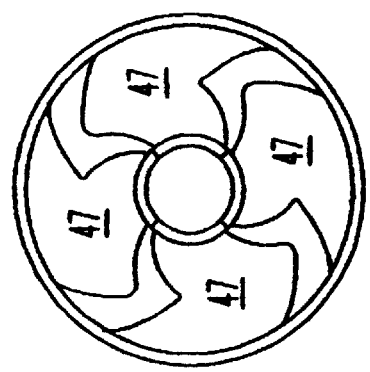
Figure 13A:
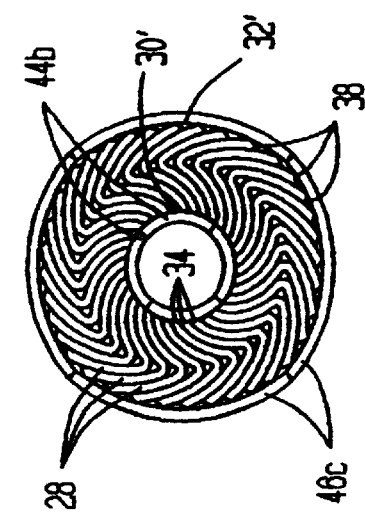
Figure 14A:
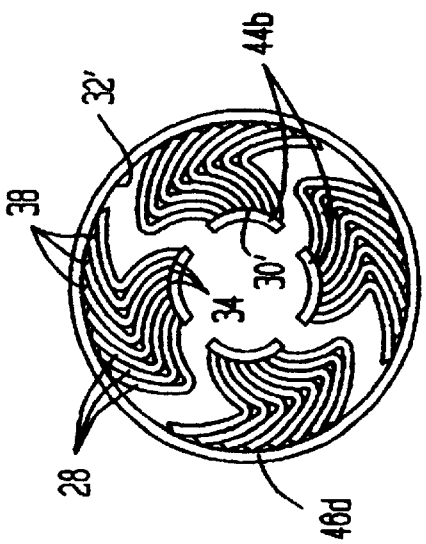

After bonding, the foils may be extended to produce interstitial separation distances between flexing sections of adjacent foils (FIG. 12c, FIG. 13b, FIG. 14b). A means for increasing springback may be provided by using, for example, garter springs 88 around extensions in the proximal collector plates 44b (FIG. 13c, FIG. 14c). Where a means for increasing springback is not required, the proximal collector plates 44a, 44b may be eliminated. Using only one tubularly-shaped proximal collector plate 44a, with one split 82 (FIG. 12c) may also provide a means for increasing springback (tubular spring).

Figure 15C:
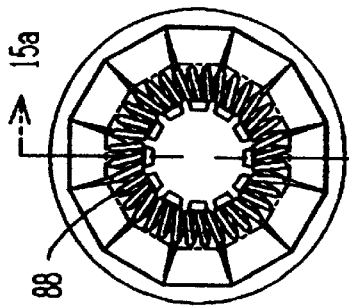
FIG. 15b and FIG. 15c show end views of the embodiment shown in FIG. 15a with and without additional radial springback means.
Figure 15B:
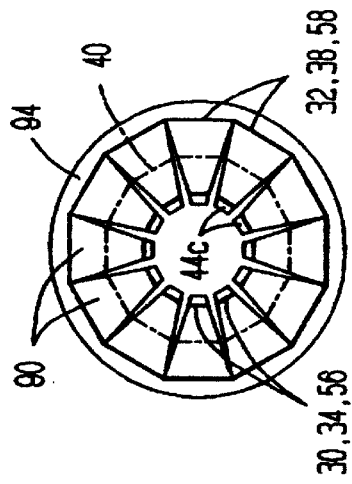
Figure 15A:
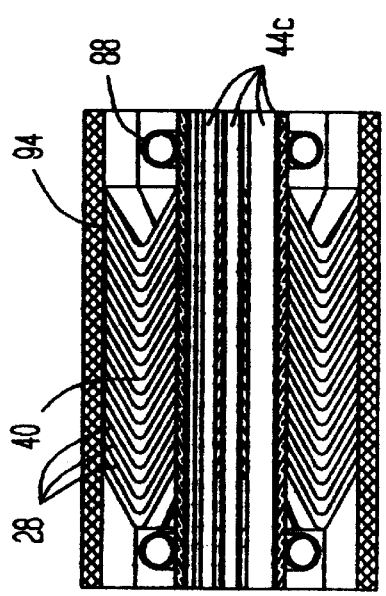
FIG. 15a shows a cross-sectional view of an aspect of a tubular embodiment of the invention with the foils fully compressed (i.e., the foils at minimum height and the inner diameter of the device at its maximum).

Other tubular embodiments of the present invention may be produced using flexible foil bundles 90, with the edges of the foils extending generally perpendicularly to the central axis of the tubular embodiment and the foil stack extending along the central axis, as shown in FIG. 15a, and FIG. 15b. Foil bundles 90 may be cut from a linear stack of foils that are densely-packed in a nested fashion with adjacent foil distal edges 38 bonded together, forming distal layer 58 and with adjacent foil proximal edges 34 bonded together, forming proximal layer 56, as described previously for generally flat embodiments. One or more foil bundles 90 (preferably wedge-shaped) may be positioned within an outer shell 94 as shown in FIG. 15b. The distal layer 58 of each foil bundle may be bonded to the outer shell 94, and the proximal layer 56 may be bonded to a proximal collector plate 44c preferably using high-temperature solder preforms. After bonding, the foil bundles 90 may be extended radially, toward the central axis of the embodiment, to produce the interstitial separation distances between the flexing sections of adjacent foils to accommodate future compression. A means for increasing springback may also be used. Means for increasing springback may be provided by, for example, but not limited to, one or more garter springs 88 (FIG. 15a, FIG. 15c) mounted around the extended ends of proximal collector plates 44c, or foil-shaped spring assemblies mounted in-line with the foil bundles. The springs 88 provide an added force to extend the foils 28 and reduce the diameter defined by proximal collector plates 44c. For devices where a means for increasing springback is not required, proximal collector plates 44c may be eliminated. For materials such as high-conductivity beryllium copper, the foil bundles 90 may be extended and aged before insertion into the outer shell 94.

Figure 16C:
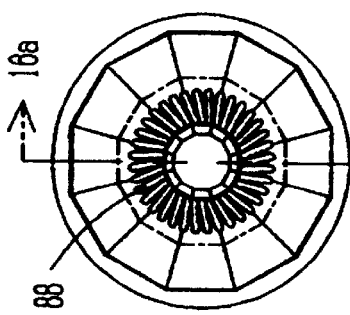
FIG. 16a, FIG. 16b and FIG. 16c show cross-sectional and end views of the tubular embodiment shown in FIG. 15a, FIG. 15b and FIG. 15c but with the inner diameter of the device at its minimum.
Figure 16B:
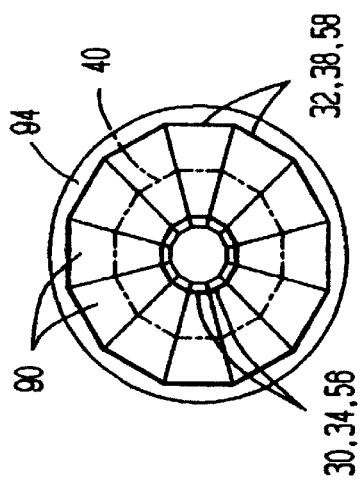
Figure 16A:
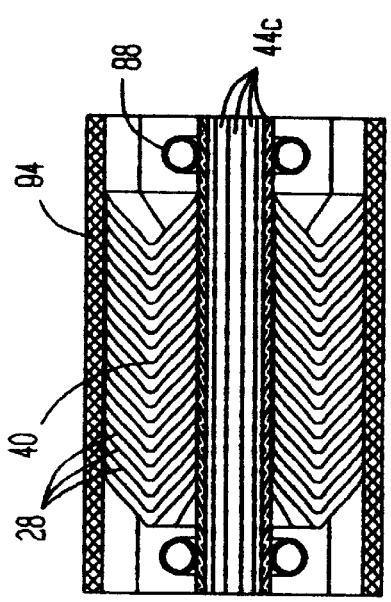

FIG. 15a, FIG. 15b, FIG. 15c, show a tubular embodiment with the foils fully compressed. This corresponds to the maximum diameter for an inserted cylindrical component with no coaxial misalignment. Similarly, FIG. 16a, FIG. 16b, FIG. 16c, show the embodiment with the foils extended such that adjacent proximal collector plates 44c are touching. This corresponds to the minimum diameter for an inserted cylindrical component with no coaxial misalignment. Insertion of a cylindrical heat generating component with a diameter between these extremes causes the foil bundles to be compressed and proximal collector plates to move from their minimum diameter position against the force of the springs 88 (and/or foil elastic springback force). Similarly, insertion of a cylindrical heat generating component that is misaligned (and a diameter between the two extremes) causes proximal collector plates 44c to realign themselves with the cylindrical component as a result of the force from the springs 88 (and/or foil elastic springback force). Since the foil bundles 90 are bonded to proximal collector plates 44c, the foils are forced into various degrees of deformation to accommodate proximal collector plates 44c and the misaligned cylindrical component.

The preferred method for making embodiments with generally flat first and second surfaces comprises pre-forming foils in a shape similar to their fully compressed shape in a bonded foil assembly. The plurality of foils 28 may be stacked directly against each other in a densely-packed, nested fashion. The resulting configuration may be similar to that shown in FIG. 2a, FIG. 4a, and FIG. 5a. The plurality of foils may be trimmed or machined as a unit. This reduces dimensional control requirements on the individual foils 28; accommodates the manufacture of large, small, short and tall foil assemblies; facilitates trimming the plurality of foils to produce flat surfaces or a distribution of foil heights for non-flat surfaces (if desired, FIG. 9b. FIG. 9c); or machining stress-relieving patterns onto the edges of the plurality of foils 28 (e.g., U.S. Pat. No. 4,156,458 herein incorporated by reference). Adjacent foil distal edges 38 within a foil assembly may be generally fixed relative to each other at the resulting distal edge spacing factor 50 and adjacent foil proximal edges 34 may be generally fixed relative to each other at the resulting proximal edge spacing factor 48. Fixing adjacent foil edges at relative spacings to each other may be done by bonding the plurality of adjacent foil proximal edges together to produce proximal layer 56 and the plurality of adjacent distal edges together to produce distal layer 58 (FIG. 5a, FIG. 5b), and/or bonding proximal 34 and distal edges 38 of the foils to first 44 and second 46 members, respectively, such as collector plates, heat generating component, cover plate, heat sink, etc. The distance between the first 30 and second 32 surfaces may then be extended. Extension may be done by attachment to, or pressure/vacuum suction against, the proximal and distal layers and/or the first and second members. The foils may be extended from the fully compressed configuration to the fully extended configuration of the foil assembly's compression range (FIG. 2b, FIG. 4b and FIG. 5b). Extending the foils in this way also produces the interstitial separation distances 42 between the flexing sections 36 of adjacent foils to accommodate future compression and tilt. A combination of over-extension and thermal stress relief may be used to control the residual stresses produced by extending the foils and any springback upon removal of the extending force. For age hardenable foil materials, such as high-conductivity beryllium copper, aging may be done after extension to impart high elastic strength.

The method of making embodiments, described above, may be altered by pre-forming foils in a shape generally similar to foils in a foil assembly at a different compression height and stacking the foils in a densely-packed, nested fashion. The foils may be stacked between a distal die 72 and a proximal die 70 (FIG. 12a) with the foils extending between the dies. The shape of the proximal die may be similar to the desired shape for the first surface 30 (or 30') and the distal die 72 similar to the desired shape for the second surface 32 (or 32'). The stack of foils may be compressed, between the dies, to the desired full compression height for the foil assembly by allowing or inducing the foils to spread out and deform in a controlled manner. Preferably, the foils are compressed until the flexing sections 36 of adjacent foils are directly against each other and the distance between the first and second surfaces is a desired minimum. Adjacent foil distal edges 38 within a foil assembly may be generally fixed relative to each other at the resulting distal edge spacing factor 50 and adjacent foil proximal edges 34 may be generally fixed relative to each other at the resulting proximal edge spacing factor 48. Fixing adjacent foil edges at relative spacings to each other may be done by bonding the plurality of adjacent foil edges together to produce proximal 56 and distal 58 layers (FIG. 5a, FIG. 5b), and/or bonding the proximal 34 and distal edges 38 of the foils within a foil assembly to a proximal collector plate 44 (or its variations 44a, 44b, 44c) and a distal collector plate 46 (or its variations 46a, 46b, 46c), respectively.

EXAMPLES

The following examples are provided for illustrative purposes and should not be construed as limiting in any manner. The data presented is based on finite element stress and thermal analysis. The thermal analysis is based on a uniform surface temperature for the electronic component and cover plate. Many design parameters, such as foil thickness, maximum compression force, range of gap distances, amount of springback, etc, were selected for general applicability but other values could easily have been selected. Three examples are described, similar to the embodiment shown in FIG. 1a and FIG. 1b, where foil materials are (a) high-purity aluminum, (b) oxygen-free electronic copper (high-purity copper) and (c) high-conductivity beryllium copper. Of the three examples, only the beryllium copper example, model (c), is limited to elastic-only deformation of the foils with a yield strength exceeding 550 MPa. All other examples use foils in the annealed state. All examples attempt to minimize the gap distance while providing a 1.8 mm. compression range or range of gap distances. The devices interface between a large, flat cover plate and a flat heat generating component of 25.4 mm. square. Maximum compression force is limited to 65 Newtons. For the elastoplastically deformable foil examples, models (a) and (b), maximum compression force is shared between the foils and helical springs 66 to provide 100% springback. The devices are wider and longer than the electronic component with a foil length of 40.6 mm and a foil stack 31.7 mm wide, resulting in a foil stack footprint of double the component area. Foil thickness is 0.0076 mm. with a profile shape as shown in FIG. 2b, FIG. 4b and FIG. 5b, a profile angle of 30 with respect to the first 30 and second 32 surfaces of the foil assembly when fully compressed (FIG. 2a, FIG. 4a, FIG. 5a), and a central bend 40 radius of 0.127 mm. The first 44 and second 46 members used for common bonding surfaces are collector plates 0.76 mm. thick made of aluminum alloy UNS-A91100 for model (a) and high strength zirconium copper UNS-C15100 for model (b) and (c). Distal 38 and proximal 34 foil edges of models (a) and (b) are bonded to the collector plates by fluxless soldering using a solder braze alloy similar to that described in PCT patent application WO 9902299. The plurality of adjacent foil edges (34 and 38) of model (c) are welded together to a shallow depth to produce proximal 56 and distal 58 layers (FIG. 5a, FIG. 5b) and soldered to collector plates.

TABLE 1

|  | model (a) | model (b) | model (c) |
| --- | --- | --- | --- |
| Foil Material | UNS 1199 99.99% Al | UNS C10100 99.99% Cu | UNS C17510 99.9% Cu 0.4% Be-1.8% Ni |
| Thermal Conductivity of foil | 243 W/m C | 391 W/m C | 240 W/m C |
| Max Gap Height | 6.6 mm. | 9.2 mm. | 8.7 mm. |
| Min Cap Height | 4.8 mm. | 7.4 mm. | 6.9 mm. |
| Helical Springs | yes | yes | no |
| Force at Max Ht | 24N | 30N | — |
| Force at Min Ht | 33N | 40N | — |
| Thermal Resistance | 0.056 C/W | 0.053 C/W | 0.083 C/W |

As can be seen in Table 1, the aluminum-based device, model (a), provides a thermal performance comparable to the copper-based device of model (b). This is due, in part, to aluminum's lower strength at high purity. A shorter device may be produced that meets the compression range and compression force requirements. Aluminum's lower density also results in a considerably lighter device with a total weight of approximately 20% of the copper-based devices of models (b) and (c).

A 1.8 mm. range of gap distances was selected to meet most printed circuit board manufacturing requirements. A reduced range may be used to produce shorter interface devices or interface devices with more foils per unit of component area (for the same compression force) resulting in higher thermal performances (e.g., for chip or die bonding applications). Similarly, reducing the 100% springback requirement reduces the impact of the springs and results in shorter devices with better thermal performances.

The present invention has been described with regard to preferred embodiments. Many modifications may be done to the described features and embodiments. For example, many densely-packed foil assemblies may be combined within a single interface device to form a large surface interface device with common collector plates. The preferred method of making the embodiments of the invention may also be modified by changing the order of some of the steps. Many more modifications may be preformed to the features, embodiments and methods of making the embodiments of the invention described herein without departing from the spirit of the invention. Furthermore, the present invention is not limited to the described methods, embodiments, features or combinations of features but include all the variations, methods, modifications and combinations of features within the scope of the appended claims.

What is claimed is:

1. An interface device, comprising:
at least one foil assembly, with said foil assembly comprised of a plurality of flexible foils (28), said foils extending between a first surface (30, 30') and a second surface (32, 32') and in a length direction, with each foil comprised of a proximal edge (34) near said first surface, a flexing section (36), and a distal edge (38) near said second surface, said foils within said foil assembly are stacked in a densely-packed, nested fashion with said proximal edges of adjacent foils distributed with a proximal edge spacing factor (48) and said distal edges of adjacent foils distributed with a distal edge spacing factor (50) so that interstitial separation distances (42) are provided between said flexing sections of adjacent foils to accommodate flexing and compression of the distance between said first surface and said second surface to a desired minimum for said foil assembly, and wherein said distribution of proximal edges with said proximal edge spacing factor (48) and said distribution of distal edges with said distal edge spacing factor (50) being established and made generally fixed when said distance between said first surface (30, 30') and said second surface (32, 32') is at said minimum for said foil assembly and said interstitial separation distances (42) between said flexing sections of adjacent foils being generally depleted and said flexing sections of adjacent foils are contacting each other for most of their surfaces.

2. The interface device of claim 1, wherein each said flexing sections (36) of said foils within said foil assembly are further comprised of at least one bend (40).

3. The interface device of claim 1, wherein each said foil has generally uniform thickness throughout.

4. The interface device of claim 2, wherein means for generally fixing said proximal edges (34) of adjacent foils within said foil assembly at said proximal edge spacing factor (48) is produced by bonding said proximal edges (34) of adjacent foils together, producing a proximal layer (56).

5. The interface device of claim 4, wherein said proximal layer (56) is flexible in a direction perpendicular to said foil length direction.

6. The interface device of claim 2, wherein means for generally fixing said proximal edges (34) of adjacent foils within said foil assembly at said proximal edge spacing factor is produced by bonding said proximal edges to a first member (44, 44a, 44b, 44c).

7. The interface device of claim 6, wherein said first member (44, 44a, 44b, 44c) with said bonds to said proximal edges (34) is flexible in a direction perpendicular to said foil length direction.

8. The interface device of claim 6, wherein said first member (44, 44a, 44b, 44c) is a heat generating component.

9. The interface device of claim 2, wherein the surfaces of said foils, excluding said proximal edge and said distal edge, are coated.

10. The interface device of claim 2, further comprises a means for increasing springback (66) to exert added force on said foil assembly to extend said distance between said first surface (30, 30') and said second surface (32, 32').

11. The interface device of claim 10, wherein said means for increasing springback comprises helical springs (66).

12. The interface device of claim 11, wherein said means for increasing springback comprises springs in a similar shape to said foils.

13. The interface device of claim 2, wherein at least one of said first surface (30') and said second surface (32') is (are) curved in a direction perpendicular to said foil length direction.

14. The interface device of claim 2, wherein at least one of said first surface (30, 30') and said second surface (32, 32') is(are) curved in a direction perpendicular to said foil length direction.

15. A method of making an interface device, comprising the steps of:

pre-forming a plurality of flexible foils (28) into a shape generally similar to their shape in a foil assembly when the distance between a first surface (30, 30') and a second surface (32, 32') is a desired minimum and each foil comprised of a proximal edge (34) near said first surface, a flexing section (36) with at least one bend (40), and a distal edge (38) near said second surface;

stacking said plurality of foils in a densely-packed, nested fashion with said flexing sections of adjacent foils contacting each other for most of their surfaces;

fixing the relative spacing between adjacent foil distal edges and fixing the relative spacing between adjacent foil proximal edges;

extending the distance between said first surface and said second surface.

16. The method as claimed in claim 15, wherein each of said foils have generally uniform thickness.

17. A method of making an interface device, comprising the steps of:

pre-forming a plurality of flexible foils (28) in a shape generally similar to their shape in a foil assembly when the distance between a first surface (30, 30') and a second surface (32, 32') is greater than a desired minimum, and each foil comprised of a proximal edge (34) near said first surface, a flexing section (36) with at least one bend (40) and a distal edge (38) neat said second surface;

stacking said plurality of foils in a densely-packed, nested fashion between at least one proximal die (70) and at least one distal die (72), with said proximal die(s) having a surface generally similar in shape to the desired shape for said first surface (30, 30') and said distal die(s) having a surface generally similar in shape to the desired shape for said second surface (32, 32'), and said foils extending generally between said proximal and distal dies;

compressing said plurality of foils between said proximal and distal dies and allowing said stack of foils to spread out and said foils to deform until said distance between said first surface and said second surface is a desired minimum;

fixing the relative spacing between adjacent foil distal edges and fixing the relative spacing between adjacent foil proximal edges when said distance between said first surface and said second surface is at said minimum and said flexing sections of adjacent foils are contacting each other for most of their surfaces; and extending said foil assembly by extending said distance between said first surface and said second surface.

18. A tubular interface device, comprising:

at least one foil assembly (47), with each foil assembly comprised of a plurality of flexible foils (28), and said foils extending generally parallel to the central axis of said device and extending between a tubularly-shaped first surface (30') and a tubularly-shaped second surface (32'), and each foil comprised of a proximal edge (34) near said tubularly-shaped first surface, a flexing section (36) with at least one bend (40), and a distal edge (38) near said tubularly-shaped second surface, said tubularly-shaped first surface comprised of at least one split (75) extending generally parallel to the central axis of said device for its entire length, and said foils within at least one of said foil assemblies (47) are stacked in a densely-packed, nested fashion, with said distal edges of adjacent foils within a foil assembly distributed with a distal edge spacing factor (50) and generally fixed relative to each other, and said proximal edges of adjacent foils within a foil assembly distributed with a proximal edge spacing factor (48) and generally fixed relative to each other, said spacing factors providing interstitial separation distances (42) between said flexing sections of adjacent foils to accommodate deformation and compression of said foils within said foil assembly and a reduction in the distance between said tubularly-shaped first and second surfaces to a desired minimum for said foil assembly, said proximal and distal edge spacing factors being fixed when said interstitial separation distances (42) are generally depleted and said flexing sections (36) of adjacent foils within at least one of said foil assemblies are generally against each other when the distance between said tubularly-shaped first surface and said tubularly-shaped second surface is at said minimum for said foil assembly, said proximal and distal edges of foils on opposite sides of said split(s) are not fixed relative to each other and said proximal and distal edge spacing factors not fixed across said split(s), so as to allow expansion in the general diameter of said tubularly-shaped first surface.

19. The tubular interface device of claim 18, further comprising a tubularly-shaped proximal collector plate (44a), said proximal collector plate being comprised of at least one split (82) extending parallel to its central axis and for its entire length, and proximal edges of foils on opposite sides of said split(s) are not fixed relative to each other, so as to allow expansion in the general diameter of said tubularly-shaped proximal collector plate.

20. The tubular interface device of claim 18, further comprising a means for increasing springback (88).

21. The tubular interface device of claim 20, wherein said means for increasing springback comprises at least one garter spring (88).

22. A tubular interface device, comprising:
an outer shell (94);
at least one foil bundle (90), with each foil bundle comprised of a plurality of flexible foils (28), and each foil comprised of a proximal edge (34) near an inner tubularly-shaped surface, a flexing section (36) with at least one bend (40), and a distal edge (38) near said outer shell, said foils within at least one of said foil bundles (90) are stacked in a densely-packed, nested fashion, with the stack extending generally along said axis of said device, and said proximal edges (34) of adjacent foils within at least one foil bundle generally fixed at a proximal edge spacing factor to each other and said distal edges (38) of adjacent foils generally fixed at a distal edge spacing, factor to each other and said distal edges fixed to said outer shell, so that interstitial separation distances (42) are provided between said flexing sections of adjacent foils within said foil bundle to accommodate flexing and compression of the distance between said inner tubularly-shaped surface and said outer shell to a desired minimum for said foil bundle, and wherein said distribution of proximal edges with said proximal edge spacing factor and said distribution of distal edges with said distal edge spacing factor being established and made generally fixed when said distance between said inner tubularly-shaped surface and said outer shell is at said minimum for said foil bundle and said interstitial separation distances (42) between said flexing sections of adjacent foils being generally depleted and said flexing sections of adjacent foils are contacting each other for most of their surfaces.

23. The tubular interface device of claim 22, wherein said proximal edges of said foils within one foil bundle (90) are bonded to a first member (44c).

24. The tubular interface device of claim 22, further comprising a means for increasing springback (88).

* * * * *